United States Patent [19]

Mizutani

[11] Patent Number: 5,583,353
[45] Date of Patent: Dec. 10, 1996

[54] HETEROJUNCTION FIELD EFFECT TRANSISTOR

[75] Inventor: Hiroshi Mizutani, Tokyo, Japan

[73] Assignee: NEC Corporation, Japan

[21] Appl. No.: 590,107

[22] Filed: Nov. 6, 1995

Related U.S. Application Data

[63] Continuation of Ser. No. 263,577, Jun. 22, 1994, abandoned.

[30] Foreign Application Priority Data

Jun. 24, 1993 [JP] Japan ..................... 5-177230

[51] Int. Cl.$^6$ .................. H01L 29/06; H01L 31/0328; H01L 31/072; H01L 31/109
[52] U.S. Cl. .................. 257/192; 257/24; 257/196; 257/27
[58] Field of Search .............. 257/24, 27, 192, 257/196, 12, 183, 194, 195

[56] References Cited

U.S. PATENT DOCUMENTS

| | | | |
|---|---|---|---|
| 4,663,643 | 5/1987 | Mimura | 257/195 |
| 4,882,608 | 11/1989 | Smith, III | 257/195 |
| 5,283,448 | 2/1994 | Bayraktaroglu | 257/192 |
| 5,381,027 | 1/1995 | Usagawa et al. | 257/192 |

FOREIGN PATENT DOCUMENTS

| | | |
|---|---|---|
| 62-16577 | 1/1987 | Japan ..................... 257/195 |
| 63-211770 | 9/1988 | Japan . |
| 2-113540 | 4/1990 | Japan ..................... 257/195 |

*Primary Examiner*—Sara W. Crane
*Assistant Examiner*—Alice W. Tang
*Attorney, Agent, or Firm*—Ostrolenk, Faber, Gerb & Soffen, LLP

[57] ABSTRACT

A heterojunction FET includes an electron supply layer formed on a non-doped semiconductor layer serving as a channel forming layer and a current path forming layer formed on the electron supply layer. The electron supply layer has an energy band gap greater than the non-doped semiconductor layer and its portion under a gate electrode is always depleted at any gate bias voltage in a bias voltage range for operating of the field effect transistor. The current path forming layer has a larger electron mobility than the electron supply layer. The gate electrode is formed on the current supply layer. Under a high gate bias voltage condition, parallel conduction does not occur in the electron supply layer but does occur in the current path forming layer. Since the current path forming layer has a larger carrier mobility than the electron supply layer, the mutual conductance value is kept high.

18 Claims, 4 Drawing Sheets

HETEROJUNCTION FIELD EFFECT TRANSISTOR

This is a continuation of U.S. application Ser. No. 08/263,577 filed Jun. 22, 1994, now abandoned.

FIELD OF THE INVENTION

The present invention relates to a heterojunction field effect transistor (FET) and, more particularly, to a heterojunction FET employing a two-dimensional electron gas.

BACKGROUND OF THE INVENTION

FIG. 1 is a sectional view of a conventional heterojunction FET. On a semi-insulating GaAs substrate 11, the following layers are deposited to form a heterojunction FET: a non-doped GaAs layer 12 serving as a channel layer, an n-AlGaAs layer 13 serving as an electron supply layer, an n$^+$-GaAs layer 15 for providing an ohmic contact that is heavily doped with Si, a gate electrode 16 forming a Schottky junction with the n-AlGaAs layer 13, and source and drain electrodes 17, 18.

FIG. 2 is a sectional view of another conventional heterojunction FET. The basic device structure is the same as in FIG. 1, but an n-GaAs layer 14 is formed on the n-AlGaAs layer 13, having the gate 16, source 17, and drain 18 formed thereon.

In such heterojunction FETs, a two-dimensional electron gas (hereinafter referred to as 2-DEG) 19 is generated in the non-doped GaAs layer 12 near the interface of the n-AlGaAs layer 13. Since the mobility of 2-DEG 19 is not reduced by impurity scattering, the heterojunction FETs can be provided with a high electron mobility and a mutual conductance (gm) that quickly rises from pinchoff.

The above types of transistor are disclosed in Japanese Patent Application Laid-open No. Sho 63-211770.

In an FET using the 2-DEG 19, when charge control of the 2-DEG 19 is performed by applying a relatively low voltage to the gate, the portion of the electron supply layer (n-AlGaAs layer 13) just under the gate is depleted and no current flows through this layer. Therefore, as shown in FIG. 3A, only 2-DEG current 19a contributes to drain current $I_D$ and gm shows a large value determined by the sheet carrier density $n_S$ of the 2-DEG 19. As the positive voltage, Vg, applied to the gate is higher, the sheet carrier density $n_S$ in the 2-DEG 19 is growing and gm increases accordingly as shown in FIG. 3B.

However, if the gate voltage Vg is further increased, the sheet carrier density $n_S$ reaches a maximum $n_{SO}$ and the conduction band of the electron supply layer 13 partially flattens to generate carriers. As a result, another current path (parallel conduction 20) occurs in the electron supply layer 13 (FIG. 3A), so that the drain current $I_D$ is given by a sum of the 2-DEG current 19a and a current due to the parallel conduction 20. Therefore, in this case, gm is determined by both the 2-DEG current 19a and the current of the parallel conduction 20. The maximum gm is obtained somewhere around this point.

After the appearance of the flat portion in the conduction band of the electron supply layer, the carrier density in the 2-DEG 19 is kept constant at $n_{SO}$ and gm is determined only by a current variation in the electron supply layer. Since the electron mobility of the AlGaAs layer 13 where the electron supply layer is formed is smaller than that of the 2-DEG 19 by more than one order, gm decreases steeply as shown in FIG. 3B.

In the conventional FET in FIG. 1, the thickness of the electron supply layer (n-AlGaAs layer 13) is considered only from the viewpoint of the ability to supply electrons to the channel layer. Therefore, the electron supply layer is usually made thick, and is made thinner only to the extent that depletion is obtained at equilibrium. Therefore, as described above, parallel conduction occurs under a high bias voltage condition, resulting in reduction of gm.

On the other hand, the conventional FET as shown in FIG. 2 exhibits a smaller reduction of gm than the FET of FIG. 1. The reason is that, in the FET of FIG. 2, parallel conduction is partly due to the GaAs layer 14, which has a larger electron mobility than the AlGaAs layer 13. However, since the carrier density in the n-GaAs layer 14 is reduced in order to form the Schottky junction, the parallel conduction in the AlGaAs layer 13 becomes dominant under higher bias voltage. Thus, the conventional FETs of FIGS. 1 and 2 have the same basic characteristics of gm-Vg as that shown in FIG. 3B.

SUMMARY OF THE INVENTION

An object of the present invention is to provide a FET having a large gm value over the entire operating range from a low gate bias voltage to a high gate bias voltage.

To achieve the above object, a heterojunction FET according to the present invention is comprised of a first semiconductor layer serving as an electron supply layer and a second semiconductor layer serving as a current path forming layer. The electron supply layer is formed on a non-doped semiconductor layer serving as a channel forming layer and has an energy band gap greater than the non-doped semiconductor layer. The portion of the electron supply layer under a gate electrode is always depleted at any gate bias voltage in the operating range of the field effect transistor. The current path forming layer is formed on the electron supply layer and has a larger electron mobility than the electron supply layer. The gate electrode is formed on the current supply layer.

With the above heterostructure, the electron supply layer remains depleted even when the maximum voltage within the operating range is applied to the gate voltage. Therefore, under any gate bias condition, the parallel conduction does not occur in the electron supply layer. Under higher gate bias voltage condition after the sheet carrier density $n_S$ has reached a maximum sheet carrier density $n_{SO}$, the parallel conduction is established on the second semiconductor layer, that is, the current path forming layer, and gm is influenced by the parallel conduction in this layer. Since the second semiconductor layer has a larger carrier mobility than the electron supply layer, the gm value can be kept higher than when parallel conduction occurs in the electron supply layer. In this manner, reduction of the gm value under a high gate bias voltage can be suppressed in the transistor according to the invention.

DETAILED DESCRIPTION OF THE INVENTION

Embodiments of the present invention will be hereinafter described with reference to the accompanying drawings.

Figure 1:
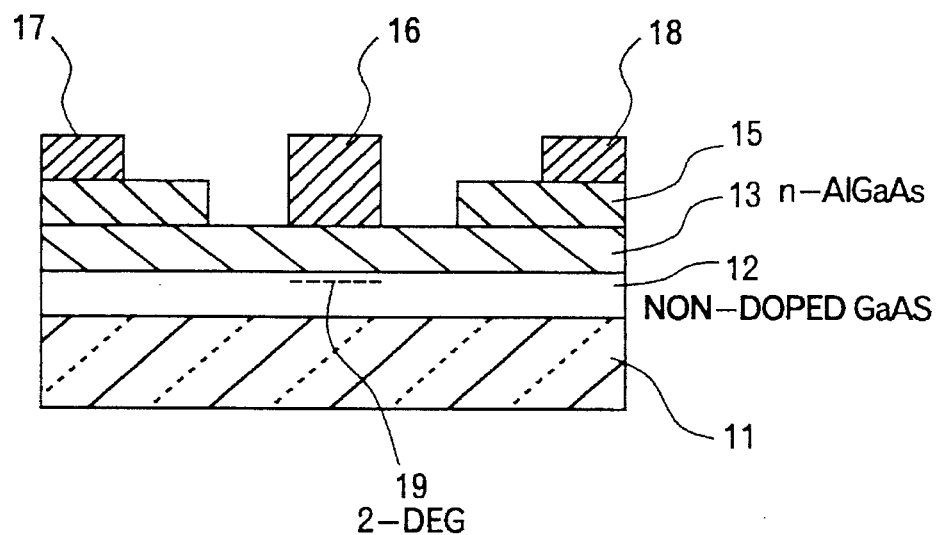
FIG. 1 is a schematic sectional view of a conventional heterojunction FET.
Figure 2:
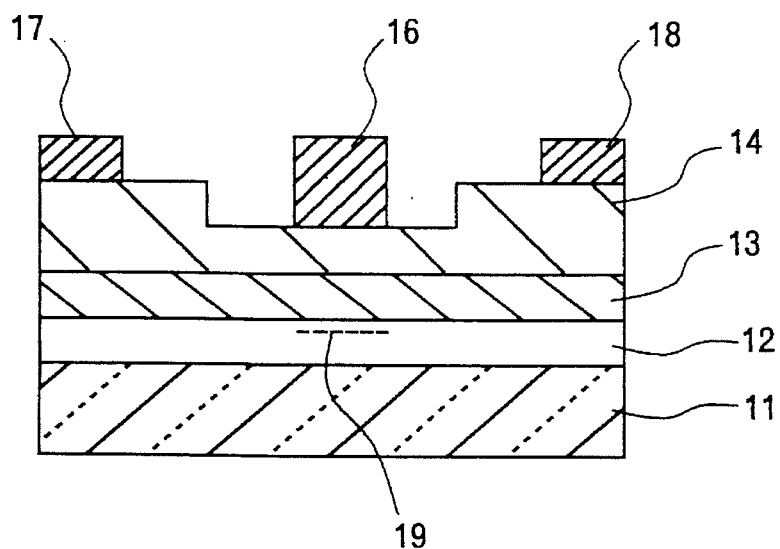
FIG. 2 is a schematic sectional view of another conventional heterojunction FET.
Figure 3A:
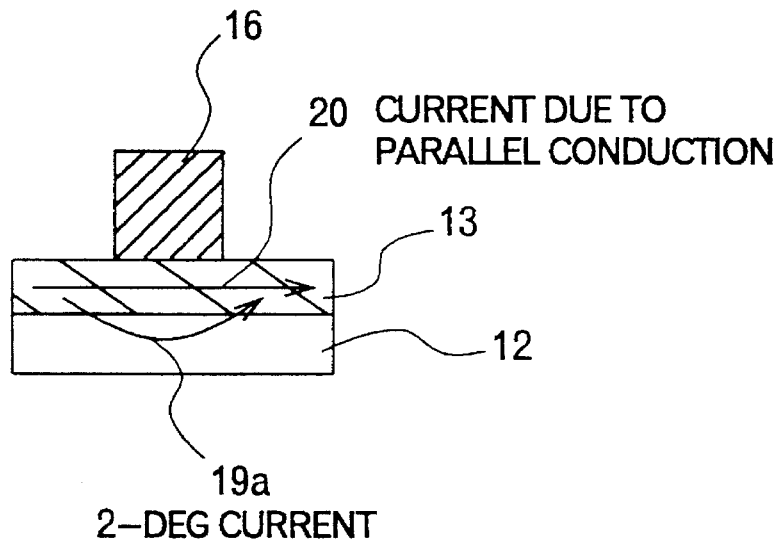
FIG. 3A is a schematic diagram showing current flows in a conventional heterojunction FET.
Figure 3B:
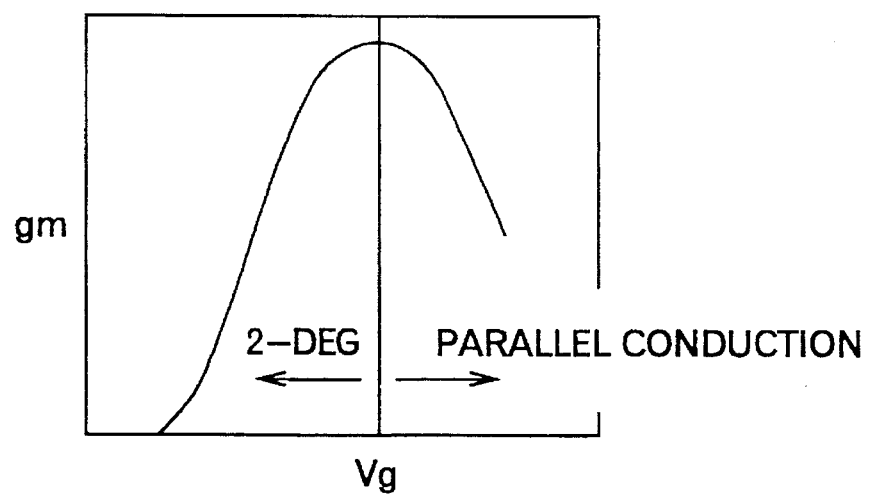
FIG. 3B is a graph of Vg-gm characteristic curve showing problems in conventional FETs.
Figure 4:
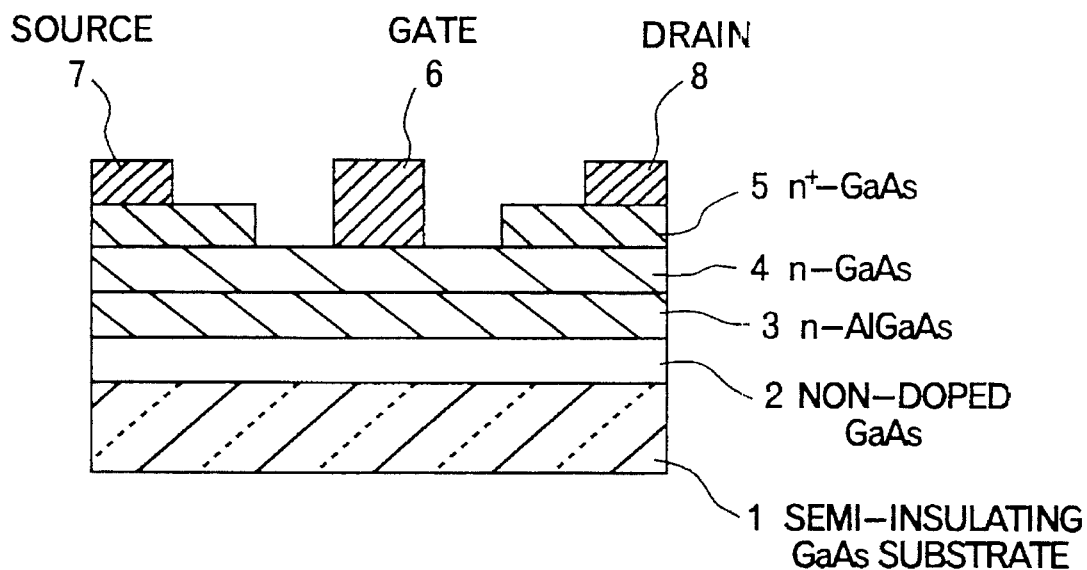
FIG. 4 is a schematic sectional view showing a heterojunction FET according to a first embodiment of the present invention.

Referring to FIG. 4, a heterojunction FET according to a first embodiment of the present invention is fabricated as follows. First, an epitaxial substrate is formed by sequentially growing the following layers on a semi-insulating GaAs substrate 1 by molecular beam epitaxy (MBE): a 1,000 Å-thick non-doped GaAs layer 2 serving as a channel layer, a 200 Å-thick n-AlGaAs layer 3 doped with Si at $2\times10^{18}$ cm$^{-3}$ and having an Al mixed crystal ratio of 0.2 that serves as an electron supply layer, a 200 Å-thick n-GaAs layer 4 doped with Si at $5\times10^{17}$ cm$^{-3}$ that serves as a current path forming layer, and an n$^+$-GaAs layer 5 doped with Si at $3\times10^{18}$ cm$^{-3}$. Further, the n$^+$-GaAs layer 5 is partially etched away to expose the surface of n-GaAs layer 4, in which a gate electrode 6 is formed. A source electrode 7 and a drain electrode 8 are formed on the n$^+$-GaAs layer 5 on either side of the gate electrode 6.

Figure 5:
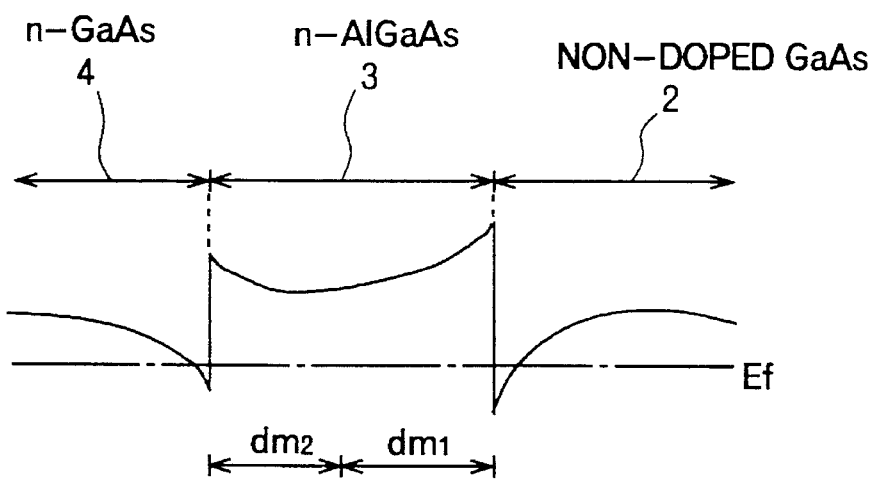
FIG. 5 is an energy band diagram showing the thickness of an electron supply layer in the first embodiment of the invention.

FIG. 5 is an energy band diagram showing how the thickness of the electron supply layer (n-AlGaAs layer 3) is determined. The invention is characterized in that the electron supply layer is always depleted under any gate bias condition so that parallel conduction does not occur there.

To form a transistor having such a function, first, the thicknesses of depletion layers extending from the top and bottom surfaces of the electron supply layer 3 are estimated as follows. With the above setting of the carrier density and mixed crystal ratio, the thickness dm$_1$ of the depletion layer extending from the channel layer (nondoped GaAs layer 2) into the electron supply layer 3 is estimated as 100 Å, and the thickness dm$_2$ of the depletion layer extending from the interface with the n-GaAs layer 4 into the electron supply layer 3 with a maximum gate voltage applied to the gate electrode 6 is also estimated as 100 Å. Therefore, the thickness of the electron supply layer 3 is set at 200 Å. The electron supply layer 3 can be depleted at any thickness not more than 200 Å. However, due to the following relationship between the thickness dm of the electron supply layer 3 and the maximum sheet carrier density n$_{SO}$:

$$dm = n_{SO}/N_D$$

where $N_D$ is a carrier density, the electron supply layer 3 must be thicker than a predetermined value to keep supplying electrons to the channel layer. This is why, in practice, the thickness of the electron supply layer 3 is set at a maximum value that satisfies the depletion requirement that it should be depleted.

Figure 6:
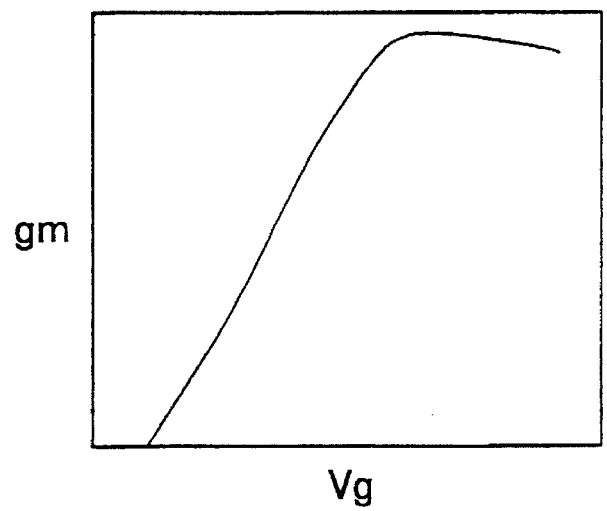
FIG. 6 is a graph showing a Vg-gm characteristic curve in the first embodiment.

FIG. 6 shows a Vg-gm characteristic of the FET formed in the above manner. In the transistor according to this embodiment, under a high gate bias voltage, no current flows through the n-AlGaAs layer 3 having a small electron mobility but, instead, parallel conduction occurs in the n-GaAs layer 4 having a large electron mobility. Therefore, the reduction of gm under a high gate bias voltage is suppressed. With a drain-to-source voltage Vds=2.0 V and a gate voltage Vg=+0.6 V, gm was 350 mS/mm in this embodiment, in contrast with 200 mS/mm in the conventional FETs.

Figure 7:
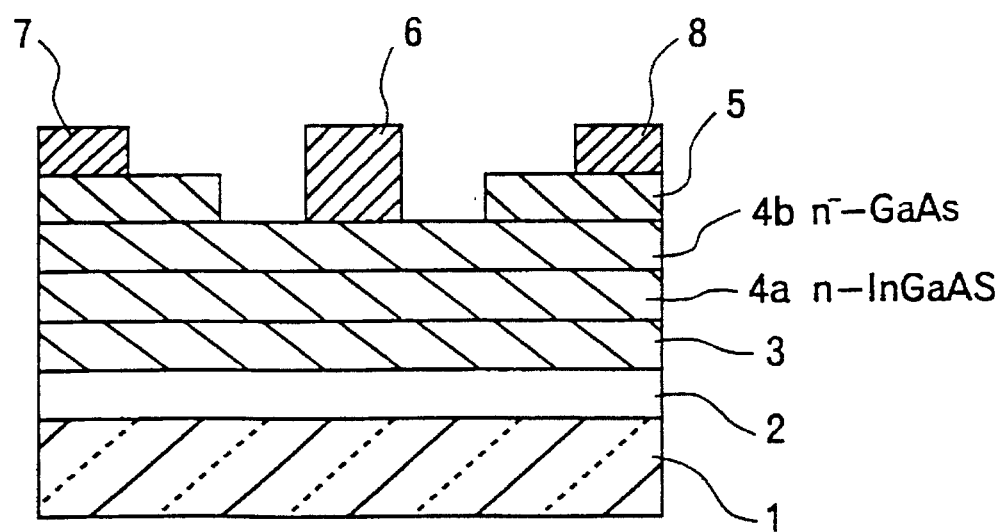
FIG. 7 is a schematic sectional view showing a second embodiment of the invention.

FIG. 7 shows a second embodiment of the invention. A FET according to this embodiment is formed by sequentially growing each of the following layers on a semi-insulating GaAs substrate 1 by the MBE method: a 1,000 Å-thick non-doped GaAs layer 2, a 200 Å-thick n-AlGaAs layer 3 doped with Si at $2\times10^{18}$ cm$^{-3}$ and having an Al mixed crystal ratio of 0.2, a 200 Å-thick n-InGaAs layer 4a doped with Si at $1\times10^{18}$ cm$^{-3}$ and having an In mixed crystal ratio of 0.2, an n$^-$-GaAs layer 4b doped with Si at $1\times10^{17}$ cm$^{-3}$, and an n$^+$-GaAs layer 5 doped with Si at $3\times10^{18}$ cm$^{-3}$. In this embodiment, a current path layer is comprised of n-InGaAs layer 4a and n$^-$-GaAs layer 4b. A good Vg-gm characteristic similar to that of the first embodiment was obtained with this embodiment as well.

When it is so desired, the current path layer formed on the electron supply layer may be made of materials other than GaAs and InGaAs as long as they provide a larger electron mobility than the electron supply layer.

Although the preferred embodiments have been described above, the invention is in no way limited to these embodiments but various modifications are possible without departing from the scope and spirit of the invention as recited in the claims. For example, InGaAs rather than GaAs can be used in the channel layer.

As described above, the heterojunction FET according to the present invention is provided with an electron supply layer and a current path layer formed on the electron supply layer, the electron supply layer being always in depletion, and the current path layer having a larger electron mobility than the electron supply layer. Therefore, according to the invention, parallel conduction can be prevented from generating in an electron supply layer under a high gate bias voltage, and, instead, parallel conduction can be established in a current path layer having a larger electron mobility than the electron supply layer. As a result, according to the invention, the reduction of gm in the high gate bias voltage range can be suppressed, and field effect transistors can be achieved which have a large gm value over the entire operating range.

I claim:

1. A field effect transistor comprising:

a gate electrode;

a pair of main electrodes;

a first semiconductor layer generating a two-dimensional electron gas to electrically connect said pair of main electrodes to each other, and an electron density of said two-dimensional electron gas varying with a gate voltage applied to said gate electrode;

a second semiconductor layer on said first semiconductor layer, a thickness of said second semiconductor layer being determined such that said second semiconductor layer being depleted at any gate voltage falling within a predetermined gate voltage range, and said second semiconductor layer supplying electrons to said first semiconductor layer; and a third semiconductor layer between said second semiconductor layer and said gate electrode, said third semiconductor layer having an electron mobility greater than an electron mobility of said second semiconductor layer, said third semiconductor layer providing a conduction path parallel to said two-dimensional electron gas when said gate voltage is higher than a predetermined gate voltage which causes said electron density of said two-dimensional electron gas to reach a maximum.

2. The field effect transistor as set forth in claim 1, wherein said first semiconductor layer is non-doped GaAs, said second semiconductor layer is N-doped AlGaAs, and said third semiconductor layer is N-doped GaAs.

3. The field effect transistor as set forth in claim 1, wherein said first semiconductor layer is non-doped InGaAs, said second semiconductor layer is N-doped AlGaAs, and said third semiconductor layer is a N-doped InGaAs layer and a N-doped GaAs layer.

4. The field effect transistor as set forth in claim 1, wherein a thickness of said second semiconductor layer is smaller than 200 angstroms.

5. The field effect transistor as set forth in claim 1, wherein said thickness of said second semiconductor layer is smaller than a minimum total thickness of a first depletion layer and a second depletion layer, said first depletion layer extending from an interface to said first semiconductor layer into said second semiconductor layer, and said second depletion layer extending from an interface to said third semiconductor layer into said second semiconductor layer.

6. The field effect transistor as set forth in claim 5, wherein said minimum total thickness is approximately 200 angstroms.

7. A semiconductor device comprising:

a semi-insulating substrate;

a channel layer formed on said semi-insulating substrate, where a two-dimensional electron gas is generated as a channel;

an electron supply layer on said channel layer, for supplying electrons to the channel layer, a thickness of said electron supply layer being determined such that said electron supply layer is depleted at any control bias voltage falling within a predetermined bias voltage range;

a current path layer on said electron supply layer, said current path layer having an electron mobility greater than an electron mobility of said electron supply layer, said current path layer providing a current path parallel to said channel when said electron density of said two-dimensional electron gas reaches a maximum;

a control electrode on said current path layer, a control voltage applied to said control electrode controlling an electron density of said two-dimensional electron gas generated in said channel layer; and a pair of main electrodes electrically connected to said two-dimensional electron gas and said current path, a main current flowing between said control electrode through said two-dimensional electron gas when said electron density of said two-dimensional electron gas is not saturated, and said main current flowing between said control electrode through both said two-dimensional electron gas and said current path when said electron density of said two-dimensional electron gas is saturated.

8. The semiconductor device as set forth in claim 7, wherein said channel layer is non-doped GaAs, said electron supply layer is N-doped AlGaAs, and said current path layer is N-doped GaAs.

9. The semiconductor device as set forth in claim 7, wherein said channel layer is non-doped InGaAs, said electron supply layer is N-doped AlGaAs, and said current path layer is a N-doped InGaAs layer and a N-doped GaAs layer.

10. The semiconductor device as set forth in claim 7, wherein a thickness of said electron supply layer is smaller than 200 angstroms.

11. The semiconductor device as set forth in claim 7, wherein a thickness of said electron supply layer is smaller than a minimum total thickness of a first depletion layer and a second depletion layer, said first depletion layer extending from an interface to said channel layer into said electron supply layer, and said second depletion layer extending from an interface to said current path layer into said electron supply layer.

12. The semiconductor device as set forth in claim 11, wherein said minimum total thickness is approximately 200 angstroms.

13. A field effect transistor comprising:

a gate electrode;

a pair of main electrodes;

a first semiconductor layer generating a two-dimensional electron gas to electrically connect said pair of main electrodes to each other, and an electron density of said two-dimensional electron gas varying with a gate voltage applied to said gate electrode, said first semiconductor layer being a non-doped compound semiconductor;

a second semiconductor layer on said first semiconductor layer, including a N-doped compound semiconductor, said second semiconductor layer having a thickness smaller than 200 angstroms such that said second semiconductor layer is depleted at any gate voltage within a predetermined gate voltage range, and said second semiconductor layer supplying electrons to said first semiconductor layer;

a third semiconductor layer between said second semiconductor layer and said gate electrode, said third semiconductor layer being a N-doped compound semiconductor and having an electron mobility greater than an electron mobility of said second semiconductor layer, said third semiconductor layer providing a conduction path parallel to said two-dimensional electron gas when said gate voltage is higher than a certain gate voltage which causes said electron density of said two-dimensional electron gas to reach a maximum, and said gate electrode being located at a predetermined position on said third semiconductor layer.

14. The field effect transistor as set forth in claim 13, wherein said first semiconductor layer is non-doped GaAs, said second semiconductor layer is N-doped AlGaAs, and said third semiconductor layer is N-doped GaAs.

15. The field effect transistor as set forth in claim 13, wherein said first semiconductor layer is non-doped InGaAs, said second semiconductor layer is N-doped AlGaAs, and said third semiconductor layer is a N-doped InGaAs layer and a N-doped GaAs layer.

16. A semiconductor device comprising:

a semi-insulating substrate;

a channel layer on said semi-insulating substrate, said channel layer being a non-doped compound semiconductor with a two-dimensional electron gas being generated as a channel;

an electron supply layer on said channel layer, said electron supply layer being a N-doped compound semiconductor for supplying electrons to the channel layer, said electron supply layer having a thickness smaller than 200 angstroms such that said electron supply layer being depleted at any control voltage falling within a predetermined voltage range;

a current path layer on said electron supply layer, said current path layer being a N-doped compound semiconductor and having an electron mobility greater than an electron mobility of said electron supply layer, said current path layer providing a current path parallel to said channel when said electron density of said two-dimensional electron gas reaches a maximum;

a control electrode on said current path layer, with a control voltage applied to said control electrode controlling an electron density of said two-dimensional electron gas generated in said channel layer; and a pair of main electrodes electrically connected to said two-dimensional electron gas and said current path, with a main current flowing between said control electrode through said two-dimensional electron gas when said electron density of said two-dimensional electron gas is not saturated, and said main current flowing between said control electrode through said two-dimensional electron gas and said current path when said electron density of said two-dimensional electron gas is saturated.

17. The semiconductor device as set forth in claim 16, wherein said channel layer is non-doped GaAs, said electron supply layer is N-doped AlGaAs, and said current path layer is N-doped GaAs.

18. The semiconductor device as set forth in claim 16, wherein said channel layer is non-doped InGaAs, said electron supply layer is N-doped AlGaAs, and said current path layer is a N-doped InGaAs layer and a N-doped GaAs layer.

* * * * *